(12) United States Patent
Zanchi et al.

(10) Patent No.: US 7,439,888 B2
(45) Date of Patent: Oct. 21, 2008

(54) METHOD FOR DIGITALLY REPRESENTING AN INTEGRAL NON-LINEARITY RESPONSE FOR A DEVICE

(75) Inventors: Alfio Zanchi, Colorado Springs, CO (US); Kevin Quynh Nguyen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 11/514,482

(22) Filed: Aug. 31, 2006

(65) Prior Publication Data

US 2007/0046509 A1    Mar. 1, 2007

Related U.S. Application Data

(60) Provisional application No. 60/712,966, filed on Aug. 31, 2005.

(51) Int. Cl.
   *H03M 1/10*    (2006.01)
(52) U.S. Cl. .................................. 341/120; 341/155
(58) Field of Classification Search ................ 341/118, 341/120, 155
   See application file for complete search history.

(56) References Cited

U.S. PATENT DOCUMENTS

| | | | |
|---|---|---|---|
| 5,861,826 | A | 1/1999 | Shu et al. |
| 6,140,949 | A | 10/2000 | Tsay et al. |
| 6,703,875 | B1 * | 3/2004 | Chuang ................. 327/144 |
| 6,882,294 | B2 | 4/2005 | Linder et al. |
| 7,091,891 | B2 * | 8/2006 | Bardsley et al. ........... 341/120 |
| 7,248,197 | B2 * | 7/2007 | Watanabe .................. 341/157 |

OTHER PUBLICATIONS

Zanchi et al.; A 16-bit 65-MS/s 3.3-V Pipeline ADC Core in SiGe BiCMOS with 78-dB SNR and 180-fs Jitter; IEEE Journal of Solid-State Circuits; vol. 40, No. 6; Jun. 2005; pp. 1225-1237.

Moreland et al.; "A 14-bit 100-Msample/s Subranging ADC"; *IEEE Journal of Solid-State Circuits*; vol. 35, No. 12; Dec. 2001; pp. 1791-1798.

(Continued)

*Primary Examiner*—Peguy JeanPierre
(74) *Attorney, Agent, or Firm*—Warren L. Franz; Wade J. Brady, III; Frederick J. Telecky, Jr.

(57) ABSTRACT

A method digitally representing an integral non-linearity response for a device includes: (a) In no particular order: (1) Identifying locations of significant departures of the integral response, including: [a] Extracting first and second differential responses from the integral response in first and second device trim states. [b] Twice-filtering first and second differential responses to produce first and second filtered responses. [c] Determining difference between first and second filtered responses to produce a treated response. [d] Identifying a locus for each maximum of the treated response in a highest excursion range and in at least one lower excursion range. [e] Imposing zero amplitude on the treated response within a code range of each locus. Locations are centered within each code range. (2) Determining magnitude for each significant departure. (b) Collecting each location in association with each magnitude for each significant departure to establish an array of location-magnitude pairs effecting the representing.

18 Claims, 7 Drawing Sheets

OTHER PUBLICATIONS

Van den Bosch et al.; "A 10-bit 1-GSample./s Nyquist Current-Steering CMOS D/A Converter"; IEEE Journal of Solid-State Circuits; vol. 36, No. 3; Mar. 2001; pp. 315-324.

Kinget et al.; "Impact of transistor mismatch on the speed-accuracy-power trade-off of analog CMOS circuits"; Proceedings of the IEEE CICC; 1996; pp. 333-336.

Lin et al. "A 13-b 2.5-MHz Self-Calibrated Pipelined A/D Converter in 3-microm CMOS"; IEEE Journal of Solid-State Circuits; vol. 26, No. 4; Apr. 1991; pp. 628-636.

Michalski; "A 12b 105Msample/S, 850mW Analog to Digital Converter"; Proceedings of the IEEE Symp. on VLSI Circuits; 2000; pp. 208-211.

* cited by examiner

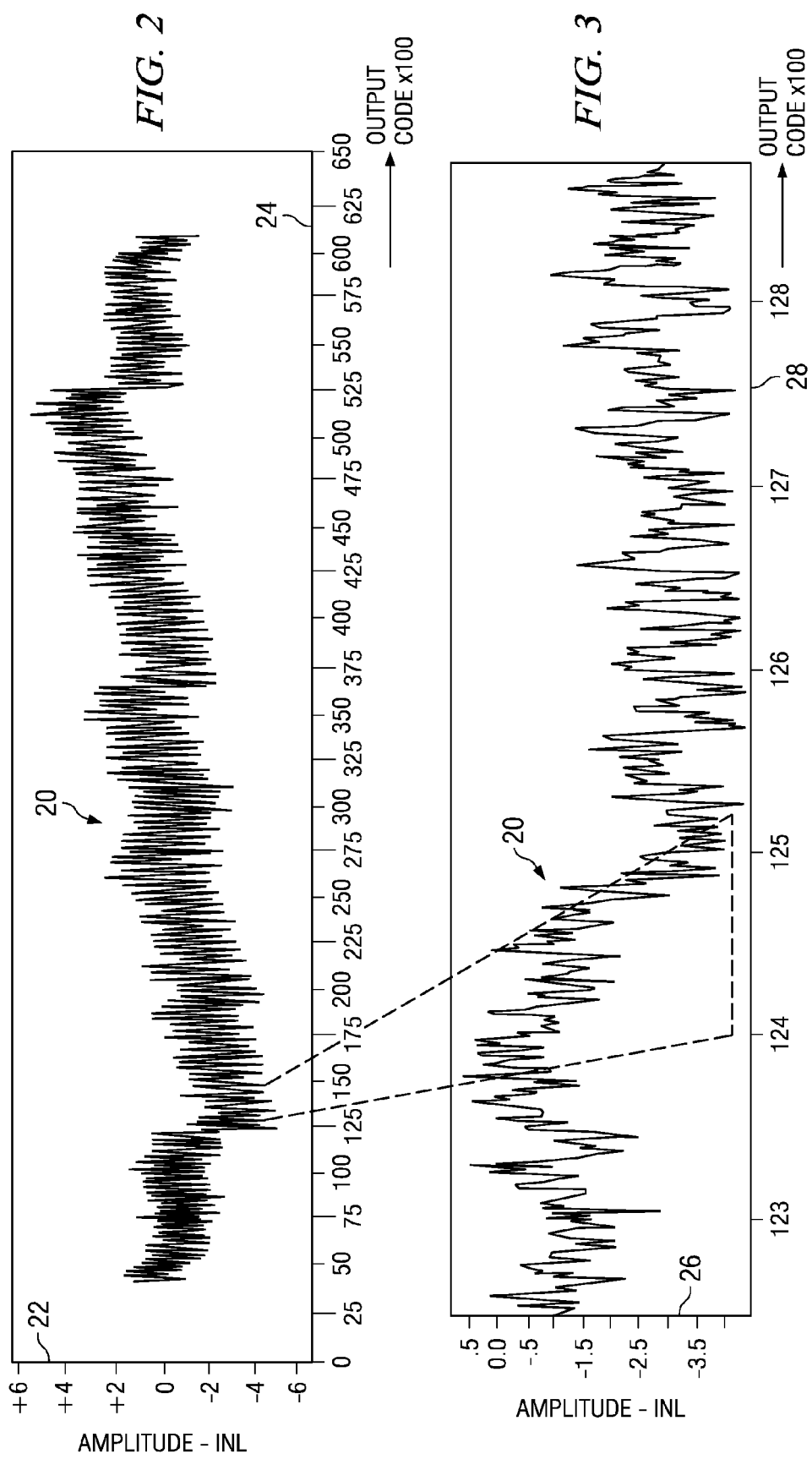

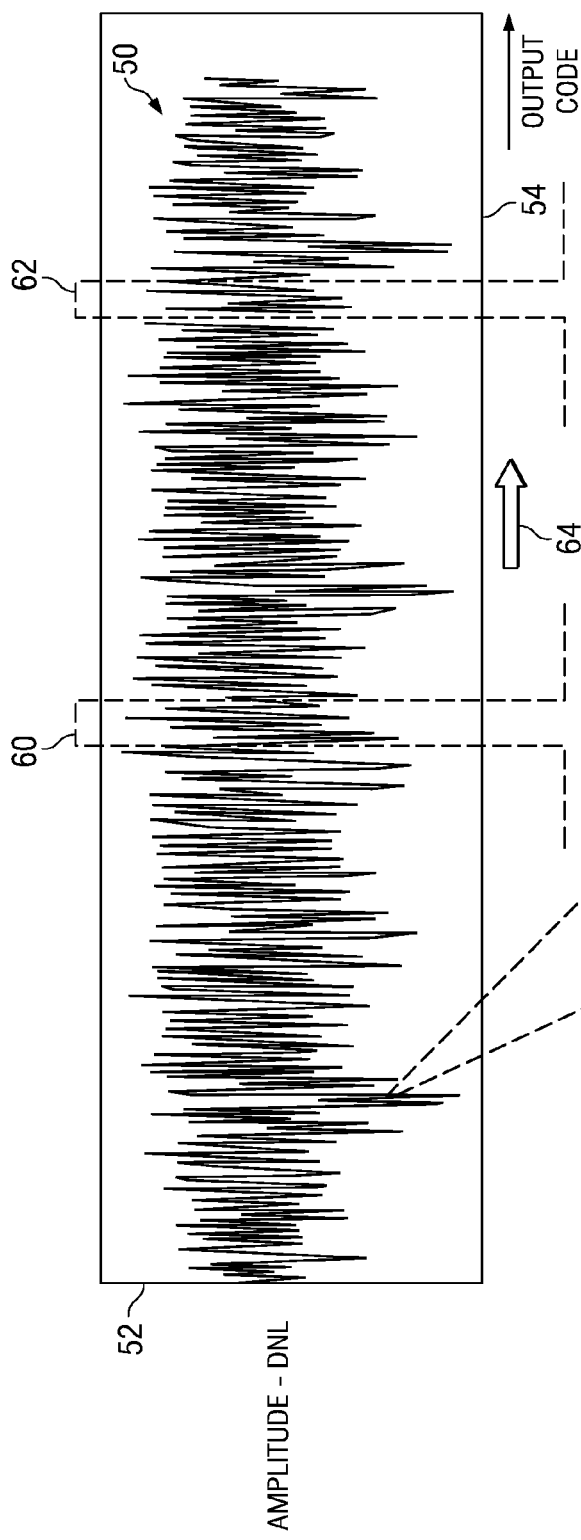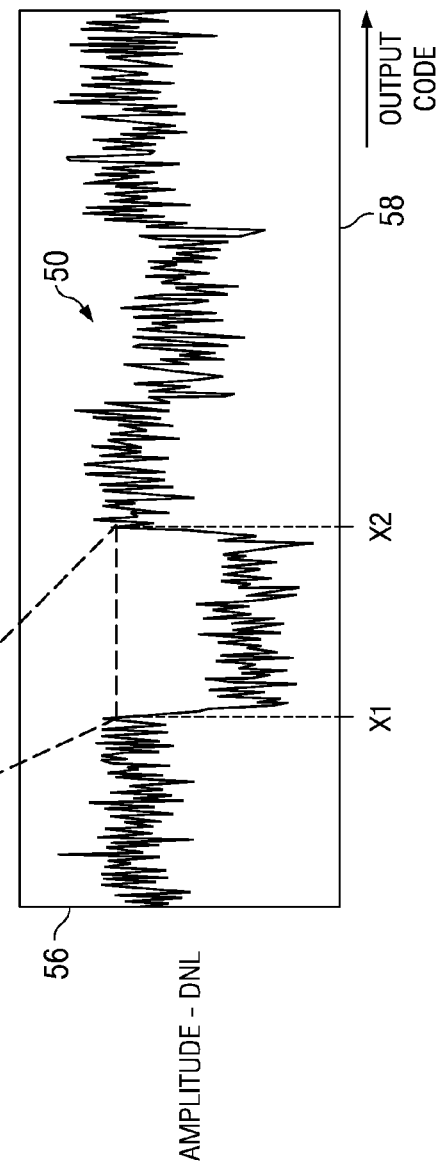

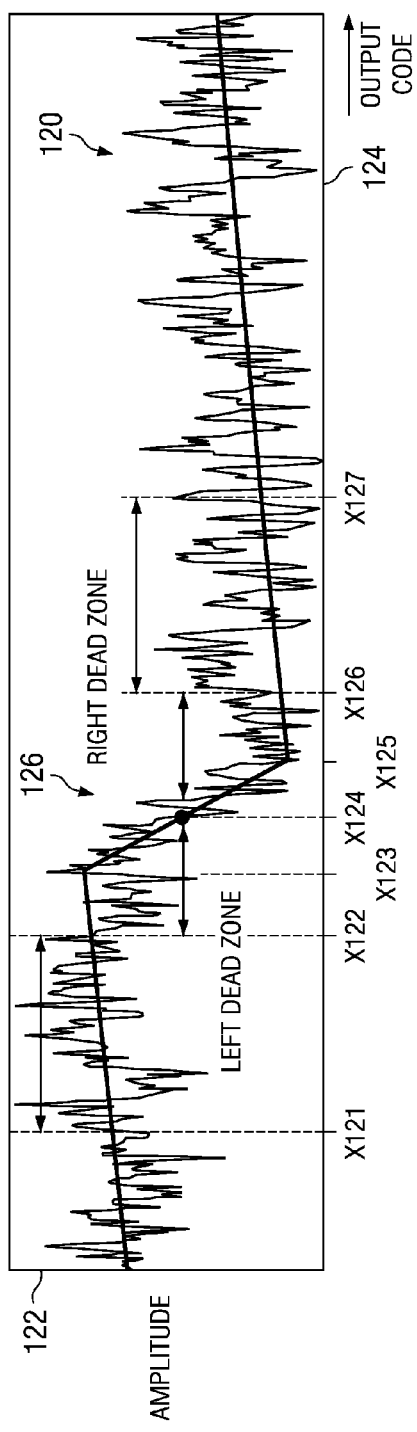
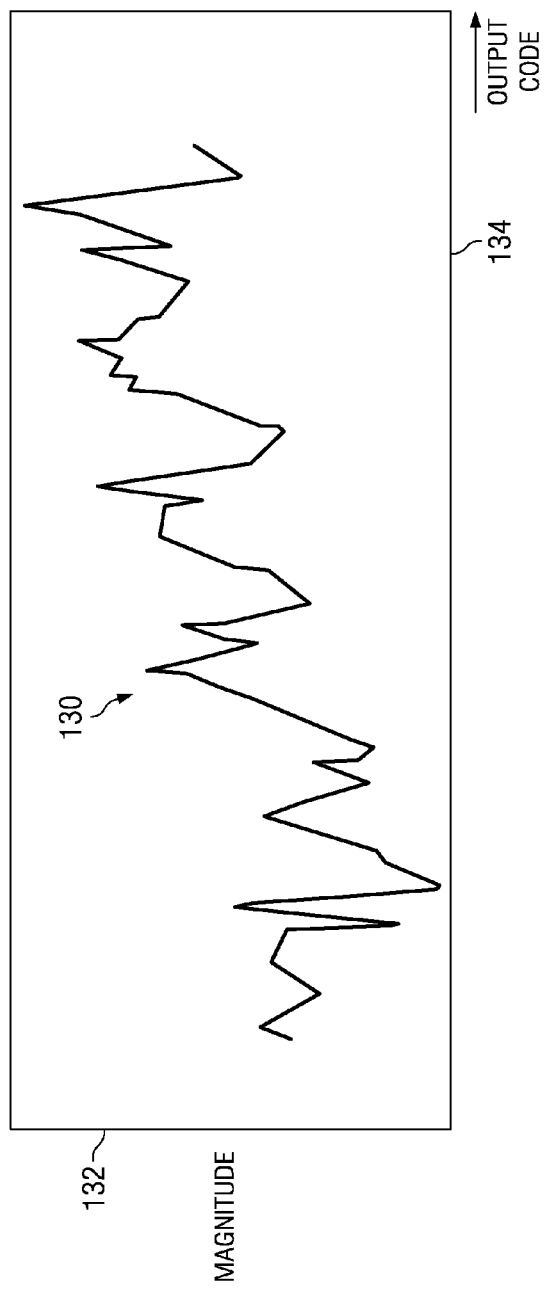

METHOD FOR DIGITALLY REPRESENTING AN INTEGRAL NON-LINEARITY RESPONSE FOR A DEVICE

This application claims benefit of prior filed Provisional Patent Application Ser. No. 60/712,966, filed Aug. 31, 2005.

BACKGROUND OF THE INVENTION

The present invention is directed to signal responses in electronic devices, and especially to non-linearity responses in electronic devices such as analog-to-digital converters.

Many ADC (Analog-to-Digital Converter) architectures implement a quantization process comprised of multiple stages to incrementally resolve the digital representation of an analog signal. Such architectures are sometimes referred to as a pipeline ADC architecture. Whether the pipeline architecture is based on switched-capacitor or a switched-current approach, the linearity—and thus the distortion performance—of the ADC is impacted by the degree of matching among components found in the local quantization circuit of each stage.

Switched-current designs will suffer from mismatches between the elements of the folding sub-ADC, and mismatches between the current sources elements constituting the reconstruction DAC (Digital-to-Analog Converter). The DAC could be segmented in different ways to vary the impact of the mismatch (e.g., unary versus binary-weighted sources). However, once a mismatch among the elementary DAC elements has been minimized, the relative current mismatch among stages comes into play.

In switched-capacitor ADC implementations the relative size of the capacitors determines the gain of a stage along with the size of the voltage steps in the local reconstruction MDAC (Multiplying Digital-to-Analog Converter), directly impacting the integral non-linearity (INL). INL describes the departure by a device, such as an ADC device, from an ideal linear transfer curve. INL is a measure of the straightness of the transfer function of the device. These technology-related mismatches among components in a device have become important in the latest releases of minimum-feature CMOS (Complementary Metal Oxide Semiconductor) processes, where the lithographic control over active and passive devices is difficult to achieve.

Techniques have been devised which employ analog or digital solutions to correct for mismatch errors. Bit-redundancy techniques have proven effective for taking care of the sub-ADC imperfections. The sub-DACs non-idealities have instead been tackled either via digital calibration methods (e.g., one-time adjustments, or continuous background calibration); or via an analog "trimming" of the devices impacted by the statistical mismatch. The trimming techniques are based on the identification of the errors affecting the INL (e.g., bowing, S-shapes, positive or negative gaps). Once the amount of the non-ideality has been assessed, the passive components determining the ADC behavior are trimmed, or adjusted, to compensate for the errors. For example, selective laser cuts can trim the value of resistors in a DAC to linearize the analog signal translation from the digital word. Alternately, tiny parasitic capacitors can be switched in parallel to the signal capacitors of a quantizer's stages to counter any mismatch, such as a process-induced component mismatch.

Digital treatment of signals is an effective approach to effecting trimming or other adjustments to a circuit for the purpose of obviating or reducing component mismatch errors, such as by trimming or by selective capacitor inclusion. Accurate treatment of a problem having analog origins, such as many component mismatch errors, using a digital signal treatment requires an accurate digital representation of analog signals and processes to be corrected.

There is a need for a method for digitally representing an analog signal such as integral non-linearity response for a device.

SUMMARY OF THE INVENTION

A method digitally representing an integral non-linearity response for a device includes: (a) In no particular order: (1) Identifying locations of significant departures of the integral response, including: [a] Extracting first and second differential responses from the integral response in first and second device trim states. [b] Twice-filtering first and second differential responses to produce first and second filtered responses. [c] Determining difference between first and second filtered responses to produce a treated response. [d] Identifying a locus for each maximum of the treated response in a highest excursion range and in at least one lower excursion range. [e] Imposing zero amplitude on the treated response within a code range of each locus. Locations are centered within each code range. (2) Determining magnitude for each significant departure. (b) Collecting each location in association with each magnitude for each significant departure to establish an array of location-magnitude pairs effecting the representing.

It is, therefore, an object of the present invention to provide a method for digitally representing an analog signal such as integral non-linearity response for a device.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 2 is a reproduction of a signal trace of integral non-linearity of a representative 16-bit analog-to-digital converter (ADC) device.

FIG. 3 is an enlarged zoom-view of a portion of the signal trace illustrated in FIG. 2.

FIG. 5 is a representation of the resulting intermediate first-filtered signal obtained by applying the first moving average filtering operation to the differential non-linearity response illustrated in FIG. 4.

FIG. 6 is an enlarged zoom-view of a portion of the intermediate appearance of the first-filtered signal trace illustrated in FIG. 5.

FIG. 12 is a representation of an integral non-linearity response annotated to illustrate the method for ascertaining magnitude of excursions in the response.

FIG. 13 is a representation of a piece-wise linear function defining a digitized representation of the integral non-linearity response illustrated in FIG. 2.

DETAILED DESCRIPTION OF THE PREFERRED EMBODIMENT

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions. A locus in a flow chart may include, by way of example and not by way of limitation, a juncture, step, site, function, query, response or other aspect, step, increment or an interstice between junctures, steps, sites, functions, queries, responses or other aspects of the flow or method represented by the chart.

Figure 1:
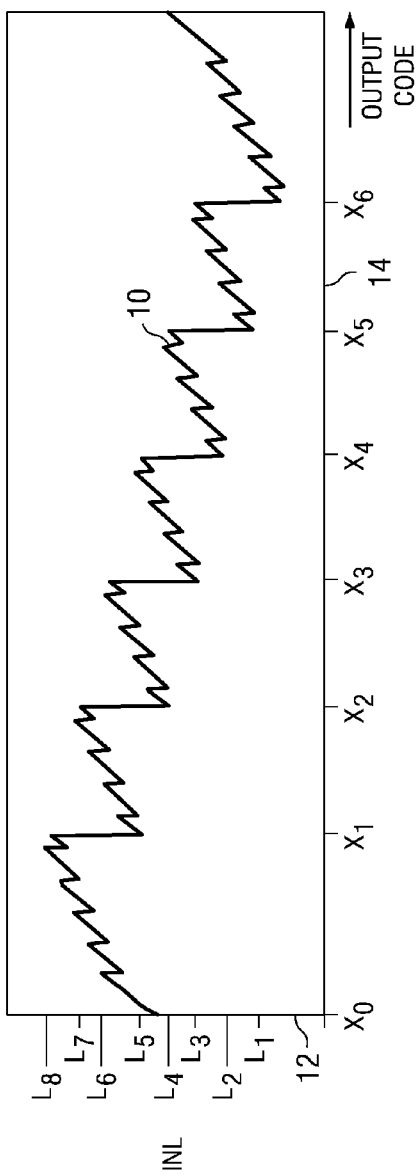
FIG. 1 is a graphic representation of integral non-linearity of a device.

FIG. 1 is a graphic representation of integral non-linearity of a device. In FIG. 1, an Integral Non-Linearity (INL) response 10 is illustrated with respect to INL values plotted on a vertical axis 12 and output code values plotted on a horizontal axis 14.

Unless time-consuming iterative approaches are followed, a trim algorithm must necessarily hinge on a reliable identification of the INL errors in order to work. By way of example and not by way of limitation, in the case of a switched-capacitor pipeline ADC with uniform 2.5 bit-per-stage segmentation, a lack of gain in the stages leads to an INL profile or response (e.g., FIG. 1), where the errors from the $(i+1)^{th}$ stage are recursively nested within the errors due to the $i^{th}$ stage. Said another way, errors from a selected stage are recursively nested within the errors caused by the next preceding stage.

One might think of trying all the different combinations of trim values and collecting INL or SFDR (Spurious Free Dynamic Range) measurements in every instance, and then settle for the best trim code. SFDR is a measure of the difference between the RMS (Root Mean Square) value of the desired value of an output signal and the highest amplitude output frequency that is not present in the input signal. SFDR is commonly expressed in dBc (decibels with respect to the "carrier", or desired output signal).

It can be demonstrated that such a brute-force solution is not practically feasible. If INL errors were decoupled from each other so that one device controlled one error, the correction problems would be decoupled and they could be fixed with minimal effort. This would present a problem very similar to solving a diagonal matrix system of equations. Such a problem would be treatable as a collection of elementary problems rather than as a complex inter-dependent set of related formulae.

In a representative multi-stage ADC (Analog-to-Digital Converter) device of switched-capacitor design, by way of example and not by way of limitation, errors from various stages are not decoupled. A feedback capacitor employed in a switched capacitor design controls the gain of a stage and hence controls all of the INL gaps contributed by all capacitors in the stage. A passive component change that fixes one error, such as trimming a feedback capacitor, can make other mismatch errors worse, such as mismatch errors contributed by other capacitors in the stage. The result is similar to using a cut-and-try method to solve a system of equations where its matrix is full, so that every unknown appears in every equation. The attempt at solution quickly becomes unmanageably complex.

By way of further example and not by way of limitation, a 4-bits accurate trim over a 2.5 bit per stage quantizer having 4 capacitors for each stage produces a string of a trim word (4bits×4capacitors=16bit-long trim word) for a total of $2^{16}$=65,536 permutations for each stage. The simultaneous trimming of just the first two stages of a pipeline, after which the required precision may be sufficiently low for a component mismatch to become less critical, would entail as many as $2^{32}$=4,294,967,296 combinations to try out. This is a difficult if not impossible endeavor, even with the most powerful computers available today. A method other than such a brute-force approach is needed to solve the problem of component mismatches.

The method of the present invention provides for a dependable recognition of even the slightest errors of the "gap" type of error (i.e., code discontinuity) occurring in the INL of a device. Gap errors, such as code discontinuities or response departures, are illustrated in FIG. 1 as occurring substantially at code values X1, X2, X3, X4, X5, X6. The method of the present invention relies on a preliminary identification of the location of such response departures or errors, such as gaps.

FIG. 2 is a reproduction of a signal trace of integral non-linearity of a representative 16-bit analog-to-digital converter (ADC) device. In FIG. 2, an Integral Non-Linearity (INL) response 20 is illustrated with respect to INL values plotted on a vertical axis 22 and output code values plotted on a horizontal axis 24. FIG. 3 is an enlarged zoom-view of a portion of the signal trace illustrated in FIG. 2. In FIG. 3, a zoom-enlarged view of INL response 20 is plotted on an expanded vertical axis 26 and output code values plotted on an expanded horizontal axis 28. Regarding FIGS. 2 and 3 together, the real INL response 20 of a 16-bit ADC illustrates how difficult such an identification process may be. The difficulty is especially evident in FIGS. 2 and 3. In FIG. 2, gaps appear to occur approximately at code values 12500, 36000 and 52300. However, details revealed in the larger-scale view of the gap appearing approximately at code value 12500 indicate that the INL non-idealities (i.e., response departures or errors) are manifested in gaps that are sunk into white noise and flicker noise and charge-injection disturbances. The gaps are further combined with distortion produced by operational amplifier devices employed in the representative ADC apparatus. Only after the gaps are located and their sizes determined, can they be processed by different algorithms that will accurately modulate the trimming or other operation to correct the INL.

The zoom-enlarged view presented in FIG. 3 shows how the response departures or errors are very fuzzy due to noise superimposed onto the general trend. It is now apparent that the entire INL optimization problem starts in reality as a mathematical problem of trend identification, on a set of noisy data, and affected by unpredictable offset. The present invention identifies the gap locations so that the amplitude of the error itself can be extracted from the noisy data. The final set of INL gap magnitudes can be used in trim algorithms that can deterministically optimize the linearity in one pass, as opposed to using prohibitively lengthy iterative solutions.

Figure 4:
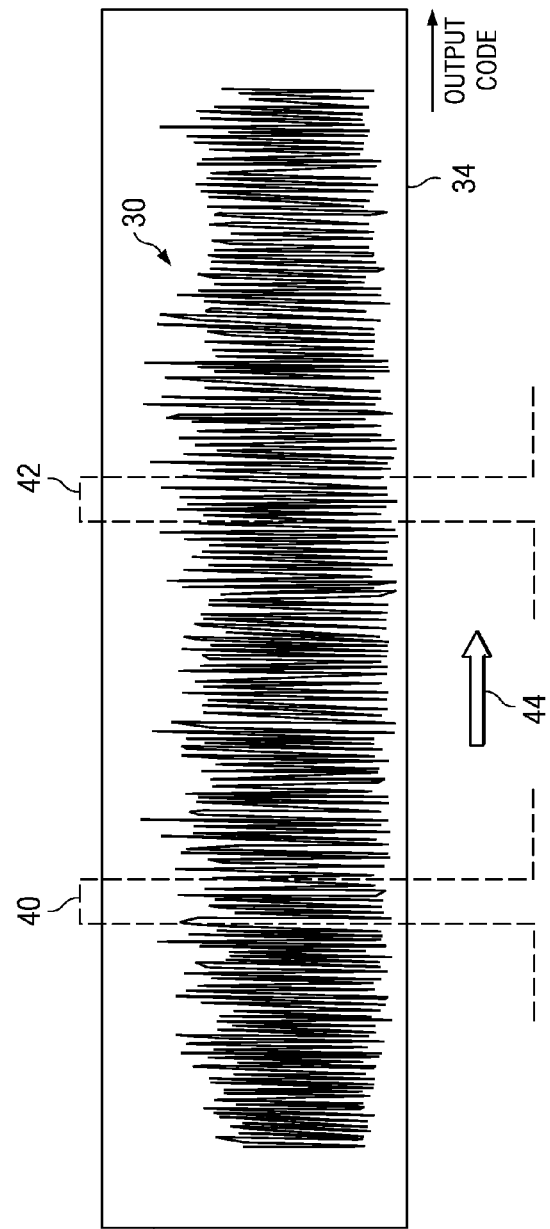
FIG. 4 is a representation of applying a first moving average filtering operation to a differential non-linearity response derived from the integral non-linearity response illustrated in FIG. 2.

FIG. 4 is a representation of applying a first moving average filtering operation to a differential non-linearity response derived from the integral non-linearity response illustrated in FIG. 2. In FIG. 4, a Differential Non-Linearity (DNL) response 30 is illustrated with respect to DNL values plotted on a vertical axis 32 and output code values plotted on a horizontal axis 34. DNL 30 is derived from the same data upon which INL plot 20 (FIGS. 2 and 3) is based. While FIG. 2 illustrates that INL response 20 may not be a good set of data to use for locating INL gaps, DNL plot 30 contains all the information about the slopes of INL plot 20 because DNL plot 30 presents a discrete numerical derivative of INL plot 20. Rather than presenting large spikes indicating INL gaps, DNL plot 30 features clusters of negative bins that, once integrated, will return INL plot 20. In other words, the information relating to gaps is presented in DNL 30 in terms of error density rather than in terms of error amplitude. To extract gap information from DNL plot 30 one must evaluate the local densities of respective bins. This is preferably accomplished with a moving average filter. By way of example and not by way of limitation one may employ a FIR (Finite Impulse Response) filter configured for effecting a "boxcar" evaluation of DNL response or plot 30. It is preferred that the boxcar range spans a code range comparable to the transition width of gaps being evaluated (e.g., approximately 100 codes in FIG. 3) to return the local trend of error within respective gaps. Employment of such an FIR boxcar-configured filter is illustrated in FIG. 4 with limits 40, 42 of a code range established and moved in a direction indicated by arrow 44. Such an FIR filtering operation will gradually start entering a respective negative bin's cluster (a negative bin cluster in DNL response 30 indicates a gap in INL plot 20); encompass the entire cluster, hence detecting a local negative area; gradually exit the respective negative cluster and return to a zero-average area. The process of FIR moving average filtering (a boxcar filter configuration) yields an intermediate appearance of a first-filtered profile of the FIR-filtered DNL plot 30 that features rectangles where the INL featured gaps. An example of such a result is presented in FIG. 5.

FIG. 5 is a representation of the resulting intermediate first-filtered signal obtained by applying the first moving average filtering operation to the differential non-linearity response illustrated in FIG. 4. In FIG. 5, a resultant FIR filtered DNL response or plot 50 resulting from effecting a moving average filtering of DNL plot 30 (FIG. 4) is illustrated with respect to DNL values plotted on a vertical axis 52 and output code values plotted on a horizontal axis 54. FIG. 6 is an enlarged zoom-view of a portion of the intermediate appearance of the first-filtered signal trace illustrated in FIG. 5. In FIG. 6, a zoom-enlarged view of first-filtered DNL response or plot 50 is plotted on an expanded vertical axis 56 and output code values plotted on an expanded horizontal axis 58. Detailed values are not provided for axes 52, 54, 56, 58 as detailed values are not important to this description. It will be recognized by those skilled in the art that the result illustrated in FIG. 5 could be equivalently achieved by filtering the integral response INL with the derivative of the boxcar FIR filter or equivalent, rather than differentiating the INL into a differential DNL and filtering such result with a boxcar FIR filter. The property of linearity of the differentiation and FIR-filtering functions allows one to invert the sequence of the procedure, or to combine some or all steps of the sequence together, and yield the same result as achieved by the present embodiment of the procedure. The embodiment described herein is a detailed sequence of elementary operations useful to implement the spirit of the invention.

Regarding FIGS. 5 and 6 together, the new data provided by first-filtered DNL plot 50 is not much more useful than INL plot 20 (FIGS. 2 and 3) with regard to the gap position identification. Because of the progressive FIR filter integration effected during the moving average filtering of the DNL cluster the new profile, intermediate appearance of the first-filtered DNL plot 50 is less affected by random noise than INL plot 20. However, the sides of the rectangles of first-filtered DNL plot 50 (such as the rectangle spanning output codes X1, X2 in FIG. 6) are more tapered than the original INL transitions in INL plot 20. Further, the tops of the rectangles (such as the rectangle spanning output codes X1, X2 in FIG. 6) are difficult to delimit. The sequence of rectangles in FIG. 5 does not look regular, not even at the expected locations of the first stage error.

The procedure effects further refinement by running an additional FIR filtering on the intermediate appearance of the first-filtered DNL data of FIG. 5. Employment of such a second FIR boxcar-configured moving average filter is illustrated in FIG. 5 with limits 60, 62 of a code range established and moved in a direction indicated by arrow 64 to obtain the final first-filtered DNL data illustrated in FIG. 7.

Figure 7:
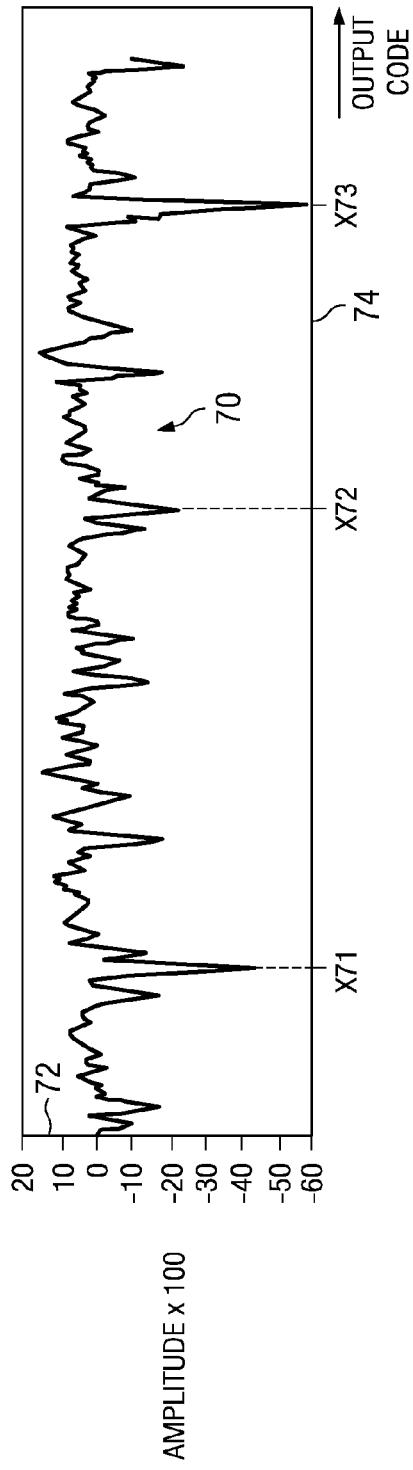
FIG. 7 is a representation of applying a second moving average filtering operation to the intermediate appearance of the first-filtered signal response illustrated in FIGS. 5 and 6 to obtain a first-filtered DNL signal.

FIG. 7 is a representation of applying a second moving average filtering operation to the intermediate appearance of the first-filtered signal response illustrated in FIGS. 5 and 6 to obtain a first-filtered DNL signal. In FIG. 7, a first-filtered DNL plot 70 resulting from effecting a moving average filtering of DNL plot 50 (FIGS. 5 and 6) is illustrated with respect to DNL values plotted on a vertical axis 72 and output code values plotted on a horizontal axis 74. Because the nature of the INL errors will force them to be clustered in a rectangular-like fashion and because the convolution of a rectangle through a FIR filter using a boxcar configuration yields a triangular shape, smoothed triangles will mark the INL discontinuities' sites (i.e., gap locations) in FIG. 7.

First-filtered DNL response 70 demonstrates the suitability of the techniques of the method of the present invention to process even the worst INL profiles. Noise has been significantly abated in first-filtered DNL response 70 by the double-filtering action so that noise no longer hinders recognition of gap locations. The maximum excursion of a triangle marking an INL discontinuity site will fall at mid-point of the rectangles of DNL response 50 (FIG. 5), which rectangles in turn fell in the middle of the clusters of DNL response 30 (FIG. 4). Of course one must account for inherent phase lag introduced by the FIR filters (substantially coincides with the boxcar span itself, after double-filtering) by subtracting it from the x-axis location of each maximum indicated for first-filtered DNL response 70.

In the various plots (FIGS. 2-7), positive and negative gaps may arise with equal probability depending on the random mismatch of components in the apparatus being evaluated. Although the first and second moving average FIR filters do not need to be identical, using substantially identical first and second moving average FIR filters is preferred. Using different FIR filters having rectangular spans to create first-filtered DNL response 70 (FIG. 7) would turn each respective maximum peak into a maxima plateau, which would be more difficult to use for accurate gap location determination. Using substantially the same FIR filter twice also permits using a simpler numerical algorithm. Alternatively, for sake of improving processing speed a single triangular FIR filtering configuration could be used. However, generating a triangular profile on a test bench is not as straightforward as generating a standard boxcar so that what appears as a simplifying practice might turn out as a disadvantage.

Once the data has been processed to present first-filtered DNL response 70 (FIG. 7), in theory a simple collection of the local maxima-minima would suffice to define the set of the gap locations within the INL. However, at some thresholds the INL of a particular part under trimming might not feature any visible gap at all. A trim algorithm will need to know that there is no gap in such a position, so the location of any missing gap must be identified. By way of example and not by way of limitation, some offset affecting one threshold in a 3-bit sub-flash ADC could shift a gap significantly away from its theoretical position so that making a rough "no maximum → no gap" inference can be unreliable. The supposed maximum could just be located a few codes away from the theoretical position.

Since the necessity for a trim algorithm implies the presence of an electrical mechanism of INL manipulation, the solution to this missing gap problem can be found by performing a differential measurement rather than a single one. By way of example and not by way of limitation, first-filtered DNL response 70 (FIG. 7) is the maxima profile for an untrimmed part. By way of example and not by way of limitation, the trim code provided to a circuit configured as described in connection with an earlier exemplary 4 bit-4 capacitors design is the starting hexadecimal 0000-0000.

Figure 8:
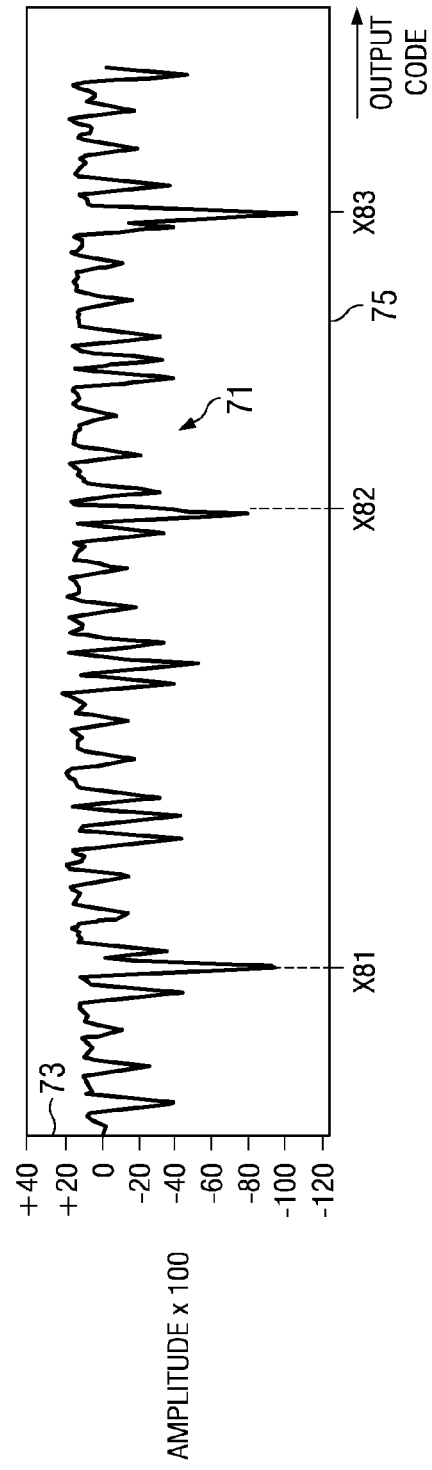
FIG. 8 is a representation of differences in the first-filtered DNL signal trace presented in FIG. 7 when certain parameters or trim factors in a device are altered and a second double filtering operation is performed.

Maximizing the feedback capacitor on the residue stage, such as by programming a trim word 000F-000F, will decrease the gain of the first and second stages and will have the effect of altering all of the INL gaps in all of the capacitors in the first and second stages of a switched capacitor design ADC, making them each more negative. The resulting second-filtered DNL signal response is illustrated in FIG. 8. Other techniques may also be employed to emphasize locations of peaks.

FIG. 8 is a representation of differences in the first-filtered DNL signal trace presented in FIG. 7 when certain parameters or trim factors in a device are altered and a second double filtering operation is performed. In FIG. 8, a maxima-enhanced second-filtered DNL plot 71 resulting from treating a first-filtered DNL response 70 to maximize peaks (as described in connection with FIG. 7) is illustrated with respect to DNL values plotted on a vertical axis 73 and output code values plotted on a horizontal axis 75.

Second-filtered DNL plot 71 (FIG. 8) is a result of treating first-filtered DNL plot 70 (FIG. 7) with trim factors and performing a second double moving average filtering operation on the trimmed first-filtered DNL plot (not shown) in a fashion similar to filtering described in connection with FIGS. 4 and 5.

Peaks occur in first-filtered DNL response 70 substantially at output codes X71, X72, X73. Corresponding maxima-enhanced peaks occur in maxima-enhanced second-filtered DNL plot 71 substantially at output codes X81, X82, X83, with noticeably greater amplitudes or magnitudes.

Figure 9:
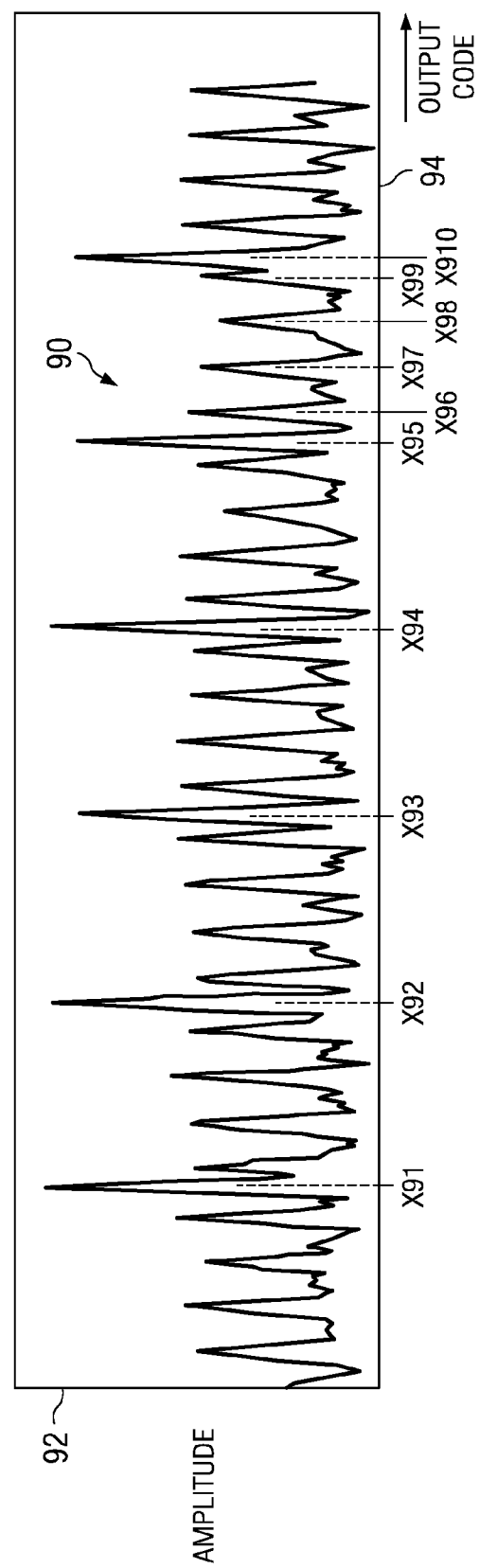
FIG. 9 is a representation of a signal resulting from taking a difference between the first-filtered signal trace of FIG. 7 and the second-filtered signal trace of FIG. 8.

FIG. 9 is a representation of a signal resulting from taking a difference between the first-filtered signal trace of FIG. 7 and the second-filtered signal trace of FIG. 8. In FIG. 9, a DNL difference response 90 resulting from taking a difference between first-filtered DNL plot 70 (FIG. 7) and maxima-enhanced second-filtered DNL plot 71 (FIG. 8) is illustrated with respect to DNL values plotted on a vertical axis 92 and output code values plotted on a horizontal axis 94.

As may be observed in FIG. 9, when the difference between first-filtered DNL plot 70 (FIG. 7) and maxima-enhanced second-filtered DNL plot 71 (FIG. 8) is taken, the full variation induced by gain is sensed. Gain depends on trim range and not on random component mismatch so gain may be controlled while designing a device. This step illustrated in FIG. 9 brings back under the designer's control what would otherwise be left to chance. The resulting plot in FIG. 9 provides a succession of higher maxima marking the large code variations induced by the first stage feedback capacitor trimming. These first stage maxima occur substantially at output code values X91, X92, X93, X94, X95, X910. A lower-amplitude series of maxima marks the locations of the smaller variations introduced in the second stage, which has been also affected by trimming. These second stage maxima occur substantially at output code values X96, X97, X98, X99. The difference between the small, at times barely visible spikes of FIGS. 7-8 compared with the well-defined peaks of FIG. 9 demonstrates the dependability of the method of the present invention.

Figure 10:
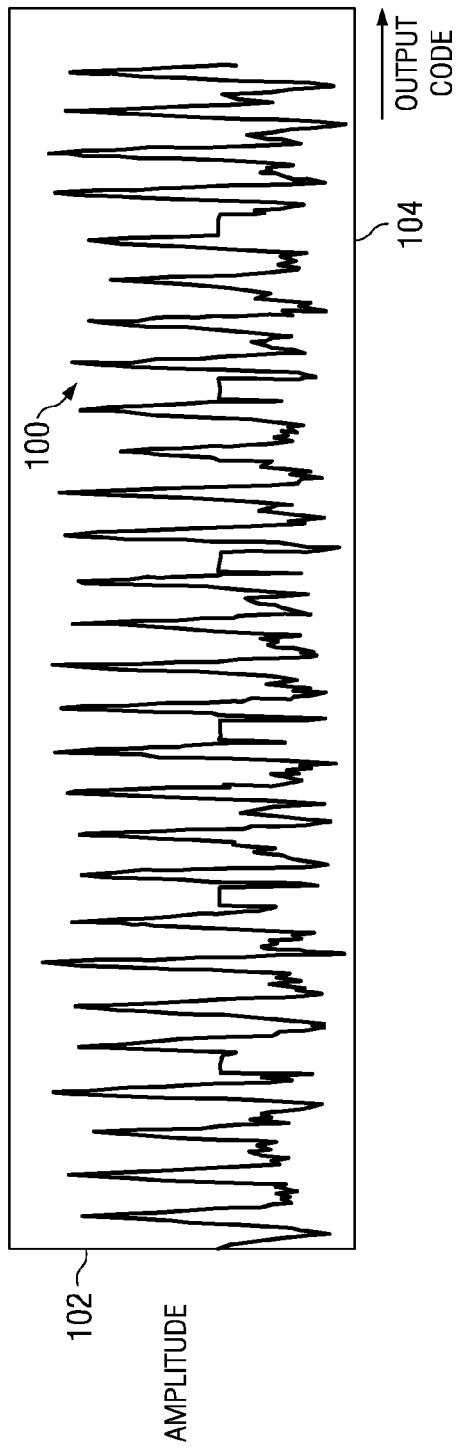
FIG. 10 is a representative signal trace resulting from imposing a zero excursion to the signal trace presented in FIG. 9 in intervals spanning signal maxima occurring within a first excursion range.

FIG. 10 is a representative signal trace resulting from imposing a zero excursion to the signal trace presented in FIG. 9 in intervals spanning signal maxima occurring within a first excursion range. In FIG. 10, a first maxima-truncated DNL difference signal 100 resulting from identifying respective maxima in DNL difference response 90 (FIG. 9) within a first amplitude or excursion range, and imposing a constant zero value to loci extending for a fixed code span around each such identified maximum. Preferably the first excursion range is appropriate to include maxima related to the first stage of a device being evaluated. First maxima-truncated DNL difference signal 100 is illustrated with respect to DNL values plotted on a vertical axis 102 and output code values plotted on a horizontal axis 104.

Because the base of a triangle generated by the second FIR filter convolution is determined by the "boxcar's" width, a suitable FIR filter boxcar span can be set that yields clear maxima while still distinguishing first stage excursions from second stage excursions. The procedure that executes the search for the maxima is also important. Rather than seeking maxima found having a certain amplitude or value (the trim range can be programmed, but is itself subject to random factors) or a certain horizontal range (horizontal range is subject to the same variability that established the need for the present invention), a multi-step procedure can preferably be followed. The preferred method will first seek the highest of the maxima, and then will assign a zero value to the horizontal range spanned by the triangle.

Because the moving average filter span (i.e., the "boxcar" range) has been previously adjusted to avoid overlap of the triangles generated by the first stage and the second stage, any next highest maximum to an earlier-identified maximum is still present in the plot. The method will identify any next highest maximum according to its respective height range during a later pass, such as in the situation illustrated in FIG. 11.

FIG. 10 shows an intermediate step of the method, illustrating the condition of first maxima-truncated DNL difference signal 100 when all the maxima within a first excursion range appropriate to include maxima related to the effect of trimming over the first stage have been recognized and zero-filled. After the condition illustrated in FIG. 10 is achieved, a second excursion range appropriate to include maxima related to the effect of trimming over the second stage is going to be addressed, as illustrated in FIG. 11.

Figure 11:
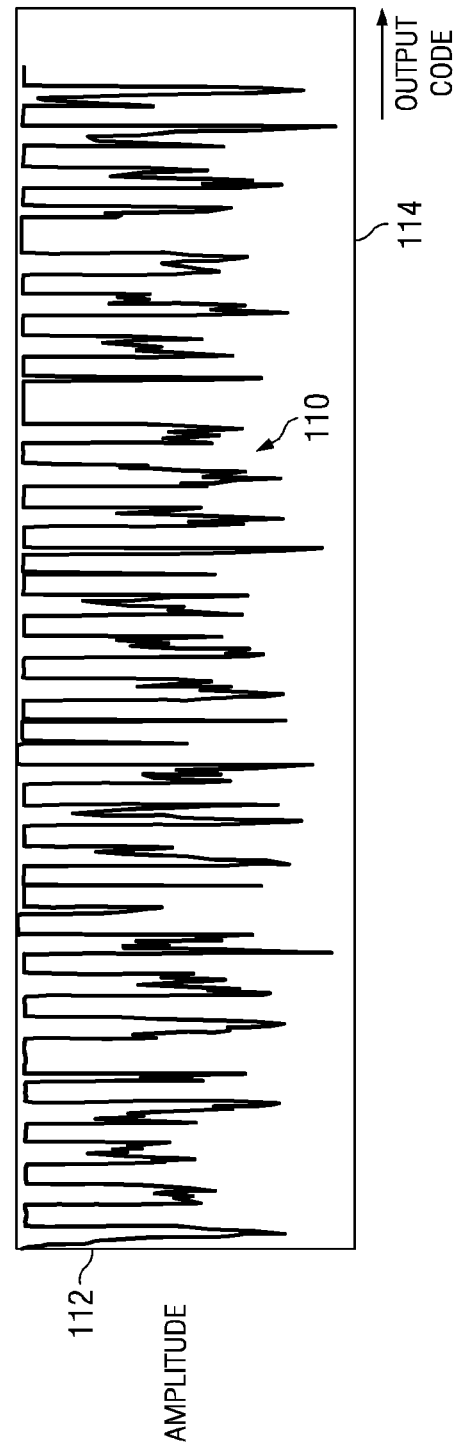
FIG. 11 is a representative signal trace resulting from imposing a zero excursion to the signal trace presented in FIG. 10 in intervals spanning the residual signal maxima occurring in the signal trace presented in FIG. 10 within a second excursion range less than the first excursion range.

FIG. 11 is a representative signal trace resulting from imposing a zero excursion to the signal trace presented in FIG. 10 in intervals spanning the residual signal maxima occurring in the signal trace presented in FIG. 10 within a second excursion range less than the first excursion range. In FIG. 11, a second maxima-truncated DNL difference signal 10 resulting from identifying respective maxima in first maxima-truncated DNL difference signal 100 (FIG. 10) within a second amplitude or excursion range and imposing a zero value to loci extending for a fixed code span around each such identified maximum. Preferably the second excursion range is appropriate to include maxima related to the second stage of a device being evaluated. Second maxima-truncated DNL difference signal 110 is illustrated with respect to DNL values plotted on a vertical axis 112 and output code values plotted on a horizontal axis 114. Suitable fixed code-spans are dependent on the specific circuit being evaluated but can be determined experimentally for a few samples of the device being evaluated and then utilized for other similar devices. Such an empirical approach involves minimal initial overhead.

Once all the second excursion range peaks have been recognized and zeroed out as depicted in FIG. 1 the iterative procedure illustrated in connection with FIGS. 10-11 may continue identifying maxima within succeeding lower adjacent excursion ranges. The procedure may be repeated until a lowest excursion range related to a predetermined excursion amplitude is addressed and no residual maximum of interest is left. In the example illustrated in connection with FIGS. 10-11, only the first and second stages of a device being evaluated are of concern so only two iterations of maxima identification and zero-value imposing are shown. In FIGS. 10-11 the procedure has produced a vector of first stage wide gap positions, and second stage narrower gap positions. The first stage wide gap positions are the six maxima identified in connection with the first amplitude excursion range (FIG. 10). The second stage narrower gap positions are the remaining maxima identified in connection with the second amplitude excursion range (FIG. 11).

Alternative settings of an algorithm exercised using the method of the present invention whereby a series of maximum positive breaks may be first programmed (e.g., in the representative switched-capacitor design ADC, a FFF0-FFF0 hexadecimal trim word) and a difference taken against the series of maximum negative breaks (e.g., a 000F-000F trim word) can also be employed for added algorithm reliability. The algorithm can be alternatively optimized for speed if, rather than performing the double-FIR filtering on the two DNL responses (e.g., in FIGS. 4-6) and then subtracting, instead the two DNL responses generated are subtracted from each other and a single series of double-FIR convolution (e.g. a "triangle" configuration FIR rather than a "boxcar") is carried out. These variants are numerical or experimental technical varieties of the method that are considered within the scope of the present invention.

FIG. 12 is a representation of an integral non-linearity response annotated to illustrate the method for ascertaining magnitude of excursions in the response. In FIG. 12, an INL response 120 for a device being evaluated is illustrated with respect to INL values plotted on a vertical axis 122 and output code values plotted on a horizontal axis 124.

After the location of the gaps has been determined, the second part of the method can determine the size of the gaps by subtracting the average of the INL values to the left of the gap from the average of the INL values to the right of the gap.

In FIG. 12, a gap 126 has a left edge substantially at output code value X123 and a right edge substantially at output code value X125. Gap 126 is centered substantially at output code value X124. Because INL is statistical in nature, noise superimposed on INL must be rejected, such as by employing a suitable average. By way of example and not by way of limitation, at least 100 to 500 bins should be averaged for a 16 bit accuracy representation of INL. Because only the location X124 of the center of gap 126 is known, the transition bins closer to center location X124 should be ignored in favor of INL values defining the left plateau between code values X121, X122 and the right plateau between code values X126, X127. INL values defining the left plateau and the right plateau will provide a good estimate as to the magnitude of gap 126. Dead zone intervals may be employed to avoid affecting average values for plateaus when gap edges are not definitely identifiable. By way of example and not by way of limitation, a left dead zone is shown in FIG. 12 between code values X122, X124 and a right dead zone is shown between code values X124, X126. Suitable average spans (e.g., span X121-X122 and span X126-X127) and "dead-zone" intervals are dependent on the specific circuit being evaluated but can be easily determined experimentally for a few samples of the device being evaluated and then utilized for other similar devices. Such an empirical approach involves minimal initial overhead. By way of example and not by way of limitation, INL averages taken over 100 bins, and starting 50 codes away from the geometrical center of a transition have proved useful for a 16 bit switched capacitor design ADC.

FIG. 13 is a representation of a piece-wise linear function defining a digitized representation of the integral non-linearity response illustrated in FIG. 2. In FIG. 13, a digital-representing function 130 is illustrated with respect to treated INL magnitude plotted on a vertical axis 132 and output code values plotted on a horizontal axis 134.

The two phases described above—gap location determination and magnitude determination—lead to a complete set of arrays in the form of horizontal positions (expressed as output codes) and gap magnitudes that constitute a digitized version of the real INL. The pre-processing of the non-linearity characteristic as described herein produces a limited set of parameters ((horizontal position, magnitude) for each gap) that can be efficiently handled by a trim algorithm.

Alternatively, the two phases described above—gap location determination and magnitude determination—may lead to a set of arrays in the form of horizontal positions (expressed as output codes) and INL pre- and post-gap magnitudes to establish an alternate digitized version of the real INL.

To quantify the reduction in complexity, one may note that the original $2^{16}$=65,536 INL values required to be addressed by a brute force approach to evaluating a device have been reduced to a set of 6×2=12 numbers [gap positions+gap magnitudes (X, Y)]. In the alternative embodiment, values required to be addressed for evaluating a device constitute a set of 6×3=18 numbers [gap positions+left and right INL averages $(X, Y_1, Y_2)$] for the first stage trimming. By way of example and not by way of limitation, the asymptotic complexity of the INL manipulation involved in exercising virtually all trim algorithms has been eased by a factor of 1,000 or more for a 16 bit case.

The final product of the method of the present invention is a representation of the true INL, that converts an Integral Non-Linearity (INL) response 20 (FIG. 2) into a piece-wise linear digital-representing function 130 (FIG. 13).

The traditional approaches to data converters trimming are based on iterative algorithms which require the measurements of some direct or indirect Figures of Merit of the ADC performance (FoM's may include INL, SNR, SFDR) to steer the method towards a best solution. Although some examples can be found in literature, especially when associated with special on-chip circuitry used for the trimming purposes, the application pertains to test and productization and is mainly of industrial interest.

U.S. Pat. No. 5,861,826, issued Jan. 19, 1999, to Shu et al. for "Method and Apparatus for Calibrating Integrated Circuit Analog-To-Digital Converters" (hereinafter referred to as "Shu") discloses using a performance-related Figure of Merit (FoM) to stop an iterative trimming algorithm once a local maximum or minimum is found. Shu's method entails collecting a series of measurements of the FoMs (e.g., SNR, SFDR, INL or DNL) and optimizing the FOM or FOMs by an analytical polynomial fitting of the FoM profiles. In contrast, the method of the present invention requires only two measurements of the INL, DNL. Requiring so fewer measurements saves significant test time for data collection and processing.

U.S. Pat. No. 6,140,949, issued Oct. 31, 2000, to Tsay et al. for "Trimming Algorithm For Pipeline A/D Converter Using Integrated Non-Linearity Measurement" (hereinafter referred to as "Tsay"), discloses trimming inside a switched-capacitor circuit using a bank of small capacitors to be inserted to compensate for mismatch. The method of the present invention is advantageous over Tsay in its straightforward identification of the gap positions in the INL. Tsay simply assumed the positions to be known, but that is rarely the case in reality, as is evident by inspecting FIG. 2 above. The multi-bit stage architectures required by high-resolution ADCs make such design assumption unlikely to be valid in high-end applications because the effects of the offsets encompass ever larger digital code spans.

The method of the present invention provides a reliable identification of the location of the INL gaps caused by gain errors in the stages and caused by capacitive mismatch in the switched-capacitor networks. Once the exact position of the gaps or non-idealities is known, the INL errors are quantified and thereafter any form of INL optimization may be implemented. Identification of gap locations is a necessary condition to enable many forms of converter trimming based on INL optimization.

The method of the present invention relies on the inherent presence of a trimming mechanism inside an ADC. The method of the present invention can be generalized from a switched-capacitor circuit design to other architectures, such as switched-current designs, by substituting "trimmed currents sources" for "trimmed capacitors".

There are no predetermined signals required to be provided to the ADC in order to implement the algorithm. An ADC needs only to be run at a desired sampling rate and input frequency. Two standard INL (or equivalently, DNL) readings then permit practicing the method of the present invention.

The method does not need to assume any behavior regularity in an ADC. The presence of offset, noise (e.g., white/random noise or switching-related noise), distortion (e.g., INL response curve assuming a bowing or an S-shape) does not impact the gap locating procedure of the present invention. The gap locating procedure discovers the INL discontinuities or gaps by evidencing them via a differential measurement; that is, all of the INL defects common to the two data collections are rejected, while the differential increase in the gaps is magnified for ease of detection (see discussion of FIGS. 7, 8).

The method of the present invention does not require additional internal circuitry overhead to be embedded in a converter other than a trim circuit itself. Because no "test mode" blocks are required by the method, there is no penalty in terms of layout or design complexity such as needing alternative signal paths, switches, multiplexers, or other additions or changes to support using the method. Requiring no layout or design changes also avoids ensuing parasitics overload that may be caused by such alterations so the original speed of the converter may be preserved in full.

The outlined procedure can be implemented in the form of an on-chip digital signal processing (DSP) engine which will require some circuit- and layout-intensive form of digital logic implementation. However, such an approach will yield advantages such as removing a need for a source forcing the input, or a need for an external apparatus for processing INL and DNL. INL and DNL can be processed on-chip in this additional embodiment using the on-board DSP engine.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for defining a digitized representation of an integral non-linearity response for a device; the method comprising the steps of:

(a) in no particular order:
  (1) identifying a respective location of each respective significant departure of said integral non-linearity response having an amplitude greater than a predetermined amplitude; said identifying comprising the steps of:
   [a] extracting a first differential non-linearity response from said integral non-linearity response in a first trim state of said device;
   [b] effecting a first double moving average filtering of said first differential non-linearity response to produce a first-filtered response;
   [c] applying at least one trim factor to said device to establish said device in a second trim state;
   [d] extracting a second differential non-linearity response from said integral non-linearity response in said second trim state;
   [e] effecting a second double moving average filtering of said second differential non-linearity response to produce a second-filtered response;
   [f] determining a difference between said first-filtered response and said second-filtered response to produce a treated differential response;
   [g] identifying a respective maximum location of each respective maximum of said treated differential response within a highest excursion range;
   [h] identifying a respective code range substantially centered about each said respective maximum location;
   [i] imposing a zero excursion on said treated differential response within each said respective code range;
   [j] repeating steps (a)(1)(g), (a)(1)(h) and (a)(1)(j) for at least one succeeding lower adjacent excursion range from said highest excursion range until a predetermined number of excursion ranges are addressed; the lowest said excursion range addressed being related to said predetermined amplitude; and (2) determining a magnitude for each respective said significant departure; said determining comprising the step of:
  [a] subtracting a first representation of selected values of said integral non-linearity response on a first side of each said respective location from a second representation of selected values on a second side of each said respective location to obtain a difference value for each said respective location; said difference value representing said magnitude for each said respective significant departure; and
 (b) collecting each said location in association with each said respective magnitude for each said respective significant departure to establish an array of location-magnitude pairs; said array of location-magnitude pairs effecting said defining.

2. A method for defining a digitized representation of an integral non-linearity response for a device as recited in claim 1 wherein each of said first and second double moving average filtering are effected using a first moving average filter and a second moving average filter; said first moving average filter and said second moving average filter being substantially similar filter units.

3. A method for defining a digitized representation of an integral non-linearity response for a device as recited in claim 2 wherein said first representation of selected values is an average of values within a first range of said integral non-linearity response, and wherein said second representation of selected values is an average of values within a second range of said integral non-linearity response.

4. A method for defining a digitized representation of an integral non-linearity response for a device as recited in claim 3 wherein said first range and said second range for each respective said location are each displaced a separation distance from said respective location.

5. A method for defining a digitized representation of an integral non-linearity response for a device as recited in claim 1 wherein said first representation of selected values is an average of values within a first range of said integral non-linearity response, and wherein said second representation of selected values is an average of values within a second range of said integral non-linearity response.

6. A method for defining a digitized representation of an integral non-linearity response for a device as recited in claim 5 wherein said first range and said second range for each respective said location are each displaced a separation distance from said respective location.

7. A method for digitally representing an integral non-linearity response for a device; the method comprising the steps of:
 (a) in no particular order:
  (1) identifying a respective location of each respective significant departure of said integral non-linearity response having an amplitude greater than a predetermined amplitude; said identifying comprising the steps of:
   [a] extracting a first differential non-linearity response from said integral non-linearity response in a first trim state of said device;
   [b] first twice-filtering said first differential non-linearity response to produce a first-filtered response;
   [c] extracting a second differential non-linearity response from said integral non-linearity response in a second trim state of said device;
   [d] second twice-filtering said second differential non-linearity response to produce a second-filtered response;
   [e] determining a difference between said first-filtered response and said second-filtered response to produce a treated response;
   [f] successively identifying a respective locus for respective maxima of said treated response in a highest excursion range and in at least one succeeding lower excursion range;
   [g] successively imposing a substantially zero amplitude excursion on said treated response within a respective code range of each said successively identified respective locus; each said respective location being situated substantially centered within each said respective code range;
  (2) determining said magnitude for each said significant departure; and
 (b) collecting each said location in association with each said respective magnitude for each said respective significant departure to establish an array of location-magnitude pairs; said array of location-magnitude pairs effecting said representing.

8. A method for digitally representing an integral non-linearity response for a device as recited in claim 7 wherein each of said first and second twice-filtering are effected using a first moving average filtering unit and a second moving average filtering unit.

9. A method for digitally representing an integral non-linearity response for a device as recited in claim 8 wherein said first moving average filtering unit and said second moving average filtering unit are substantially similar.

10. A method for digitally representing an integral non-linearity response for a device as recited in claim 9 wherein said determining a magnitude for each respective said significant departure comprises the step of:
 (a) subtracting a first representation of selected values of said integral non-linearity response on a first side of each said respective location from a second representation of selected values on a second side of each said respective location to obtain a difference value for each said respective location; said difference value representing said magnitude for each said respective significant departure.

11. A method for digitally representing an integral non-linearity response for a device as recited in claim 10 wherein said first representation of selected values is an average of values within a first range of said integral non-linearity response, and wherein said second representation of selected values is an average of values within a second range of said integral non-linearity response.

12. A method for digitally representing an integral non-linearity response for a device as recited in claim 11 wherein said first range and said second range for each respective said location are each displaced a separation distance from said respective location.

13. A method for digitally representing an integral non-linearity response for a device as recited in claim 7 wherein said determining a magnitude for each respective said significant departure comprises the step of:
 (a) subtracting a first representation of selected values of said integral non-linearity response on a first side of each said respective location from a second representation of selected values on a second side of each said respective location to obtain a difference value for each said respective location; said difference value representing said magnitude for each said respective significant departure.

14. A method for digitally representing an integral non-linearity response for a device as recited in claim 13 wherein said first representation of selected values is an average of values within a first range of said integral non-linearity response, and wherein said second representation of selected values is an average of values within a second range of said integral non-linearity response.

15. A method for digitally representing an integral non-linearity response for a device as recited in claim 14 wherein said first range and said second range for each respective said location are each displaced a separation distance from said respective location.

16. A method for digitally representing an integral non-linearity response for a device; the method comprising the steps of:
 (a) in no particular order:
  (1) identifying a respective location of each respective significant departure of said integral non-linearity response having an amplitude greater than a predetermined amplitude; and
  (2) determining a magnitude for each respective said significant departure; said determining comprising the step of:
   [a] subtracting a representation of selected values of said integral non-linearity response on a first side of each said respective location from a representation of selected values on a second side of each said respective location to obtain a difference value for each said respective location; said difference value representing said magnitude for each said respective significant departure; and
 (b) collecting each said location in association with each said respective magnitude for each said respective significant departure to establish an array of location-magnitude pairs; said array of location-magnitude pairs effecting said representing.

17. A method for digitally representing an integral non-linearity response for a device as recited in claim 16 wherein said first representation of selected values is an average of values within a first range of said integral non-linearity response, and wherein said second representation of selected values is an average of values within a second range of said integral non-linearity response.

18. A method for digitally representing an integral non-linearity response for a device as recited in claim 17 wherein said first range and said second range for each respective said location are each displaced a separation distance from said respective location.

* * * * *